United States Patent
Yu et al.

(10) Patent No.: US 11,997,935 B2
(45) Date of Patent: May 28, 2024

(54) RESISTIVE RANDOM-ACCESS MEMORY (RRAM) DEVICE AND FORMING METHOD THEREOF

(71) Applicant: UNITED MICROELECTRONICS CORP., Hsin-Chu (TW)

(72) Inventors: Shu-Hung Yu, Kaohsiung (TW); Chun-Hung Cheng, Kaohsiung (TW); Chuan-Fu Wang, Miaoli County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/953,341

(22) Filed: Sep. 27, 2022

(65) Prior Publication Data

US 2023/0019178 A1 Jan. 19, 2023

Related U.S. Application Data

(63) Continuation of application No. 17/211,875, filed on Mar. 25, 2021, now Pat. No. 11,489,114.

(30) Foreign Application Priority Data

Feb. 25, 2021 (CN) .......................... 202110212202.2

(51) Int. Cl.
*H10N 70/00* (2023.01)

(52) U.S. Cl.
CPC ......... *H10N 70/826* (2023.02); *H10N 70/063* (2023.02); *H10N 70/841* (2023.02); *H10N 70/8833* (2023.02)

(58) Field of Classification Search
CPC .. H10N 70/826; H10N 70/063; H10N 70/841; H10N 70/8833; H10N 70/24; H10N 70/821
See application file for complete search history.

(56) References Cited

U.S. PATENT DOCUMENTS

| | | | |
|---|---|---|---|
| 2009/0166817 A1* | 7/2009 | Tsai | H01L 23/53295 257/E23.001 |
| 2019/0305218 A1 | 10/2019 | Trinh | |
| 2021/0013407 A1 | 1/2021 | Xiao | |
| 2021/0135105 A1* | 5/2021 | Chen | H10N 70/883 |
| 2022/0158091 A1* | 5/2022 | Ando | H10B 63/30 |

* cited by examiner

*Primary Examiner* — Shih Tsun A Chou
(74) *Attorney, Agent, or Firm* — Winston Hsu

(57) ABSTRACT

A resistive random-access memory (RRAM) device, including a bottom electrode, a high work function layer, a resistive material layer and a top electrode sequentially stacked on a substrate, wherein the resistive material layer includes a bottom part and a top part, first spacers covering sidewalls of the top part and the top electrode, and second spacers covering sidewalls of the bottom part, thereby constituting a RRAM cell.

14 Claims, 3 Drawing Sheets

RESISTIVE RANDOM-ACCESS MEMORY (RRAM) DEVICE AND FORMING METHOD THEREOF

CROSS REFERENCE TO RELATED APPLICATIONS

This application is a continuation application of U.S. application Ser. No. 17/211,875, filed on Mar. 25, 2021. The content of the application is incorporated herein by reference.

BACKGROUND OF THE INVENTION

1. Field of the Invention

The present invention relates to a resistive random-access memory (RRAM) device and forming method thereof, and more particularly, to a resistive random-access memory (RRAM) device applying high work function spacers and forming method thereof.

2. Description of the Prior Art

In semiconductor processes, a resistive random-access memory is composed of two upper and lower metal electrodes and a transition metal oxide (IMO). The operating theory is to use the variable resistance of the transition metal oxide. The applied bias voltage changes to induce different resistance values, and the internal stored value is determined by the internal resistance.

SUMMARY OF THE INVENTION

The present invention provides a resistive random-access memory (RRAM) device and forming method thereof, which forms two kinds of spacers to cover resistive material layers, to prevent oxygen atoms in dielectric layers from diffusing into oxygen vacancies of the resistive material layers, thereby degrading of switching resistance states can being avoided.

The present invention provides a resistive random-access memory (RRAM) device, including a bottom electrode, a high work function layer, a resistive material layer and a top electrode sequentially stacked on a substrate, wherein the resistive material layer includes a bottom part and a top part, first spacers covering sidewalls of the top part and the top electrode, and second spacers covering sidewalls of the bottom part, thereby constituting a RRAM cell.

The present invention provides a method of forming a resistive random-access memory (RRAM) device including the following steps. A bottom electrode layer, a high work function material layer, a bottom resistive layer, a top resistive layer, and a top electrode layer are sequentially deposited on a substrate. The top electrode layer and the top resistive layer are patterned to form a top electrode and a top part of a resistive material layer. First spacers are formed to cover sidewalls of the top part. The bottom resistive layer, the high work function material layer and the bottom electrode layer are patterned to form a bottom part of the resistive material layer, a high work function layer and a bottom electrode. Second spacers are formed to cover sidewalls of the bottom part, thereby constituting a RRAM cell.

According to the above, the present invention provides a resistive random-access memory (RRAM) device and forming method thereof, which forms two kinds of spacers to cover a resistive material layer. For example, a bottom electrode layer, a high work function material layer, a bottom resistive layer, a top resistive layer, and a top electrode layer are sequentially deposited on a substrate; the top electrode layer and the top resistive layer are patterned to form a top electrode and a top part of a resistive material layer. First spacers are formed to cover sidewalls of the top part; the bottom resistive layer, the high work function material layer and the bottom electrode layer are patterned to form a bottom part of the resistive material layer, a high work function layer and a bottom electrode; second spacers are formed to cover sidewalls of the bottom part, thereby constituting a RRAM cell. This prevents oxygen atoms in a dielectric layer covering the RRAM cell from diffusing into oxygen vacancies of the resistive material layer, thereby degrading of switching resistance states can being avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
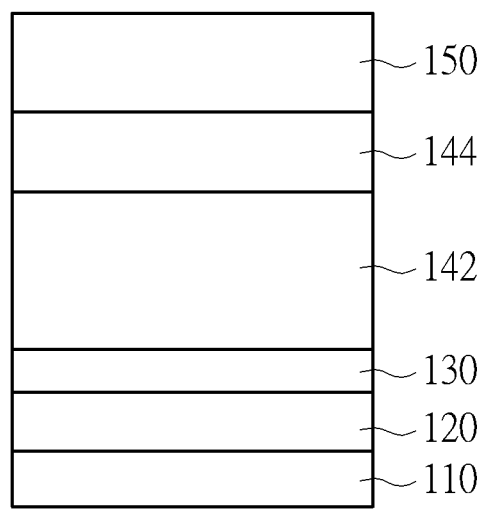
FIG. 1 schematically depicts a cross-sectional view of a method of forming a resistive random-access memory (RRAM) device according to an embodiment of the present invention.

FIGS. 1-6 schematically depict cross-sectional views of a method of forming a resistive random-access memory (RRAM) device according to an embodiment of the present invention. As shown in FIG. 1, a substrate 110 is provided, wherein the substrate 110 may be a silicon substrate, a silicon containing substrate, a III-V group-on-silicon (such as GaN-on-silicon) substrate, a silicon carbide substrate, an aluminum oxide substrate, a graphene-on-silicon substrate or a silicon-on-insulator (SOI) substrate. In this embodiment, only a resistive random-access memory area of the substrate 110 is depicted.

A bottom electrode layer 120, a high work function material layer 130, a bottom resistive layer 142, a top resistive layer 144 and a top electrode layer 150 are sequentially deposited on the substrate 110. In this embodiment, the bottom electrode layer 120 and the top electrode layer 150 may include tantalum nitride (TaN) or titanium nitride (TiN)

etc, and the bottom resistive layer 142 and the top resistive layer 144 may include metal oxide layers. Preferably, the bottom resistive layer 142 and the top resistive layer 144 may include tantalum oxide or hafnium oxide. For operating the resistive random-access memory (RRAM) device with the bottom electrode layer 120 and the top electrode layer 150 being tantalum nitride (TaN) or titanium nitride (TiN) and the resistive layers being metal oxide layers, a voltage difference is forced to the RRAM cells to induce oxygen vacancies in parts of the resistive layers, so that resistance states can be switched through changing the distribution of the oxygen vacancies caused by tuning applied voltage, and thus the resistive random-access memory (RRAM) device can be written or erased. In this case, the high work function material layer 130 includes Iridium (Ir), the bottom resistive layer 142 and the top resistive layer 144 include tantalum oxide, and the bottom electrode layer 120 and the top electrode layer 150 include tantalum nitride (TaN), but it is not limited thereto. In a preferred embodiment, the bottom resistive layer 142 is a $Ta_2O_5$ layer and the top resistive layer 144 is a tantalum oxide ($TaO_x$) layer, to form the bottom resistive layer 142 with oxygen vacancies after voltage difference is applied to the RRAM cells.

Figure 2:
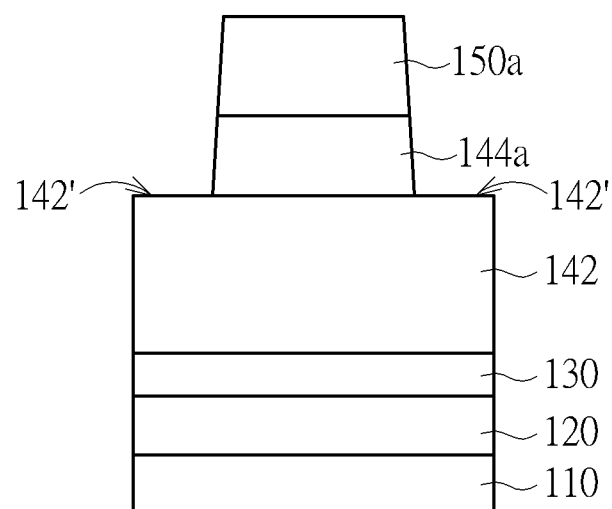
FIG. 2 schematically depicts a cross-sectional view of a method of forming a resistive random-access memory (RRAM) device according to an embodiment of the present invention.

As shown in FIG. 2, the top electrode layer 150 and the top resistive layer 144 are patterned to form a top electrode 150a and a top part 144a, and to expose parts 142' of the bottom resistive layer 142. In this embodiment, the top part 144a and the top electrode 150a constitute a trapezoidal shape cross-sectional profile, but it is not limited thereto. In other embodiments, the top part 144a and the top electrode 150a may have a step-shape cross-sectional profile.

Figure 3:
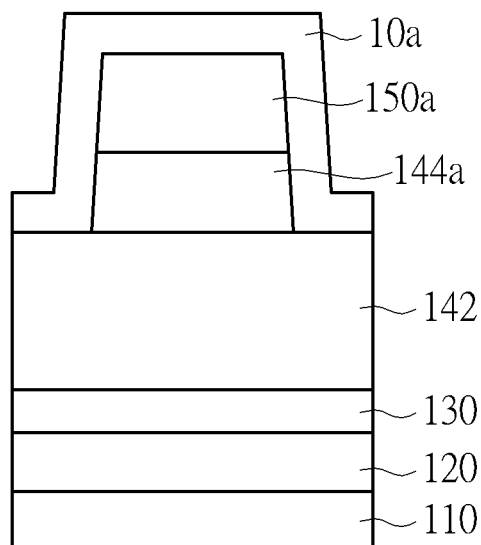
FIG. 3 schematically depicts a cross-sectional view of a method of forming a resistive random-access memory (RRAM) device according to an embodiment of the present invention.
Figure 4:
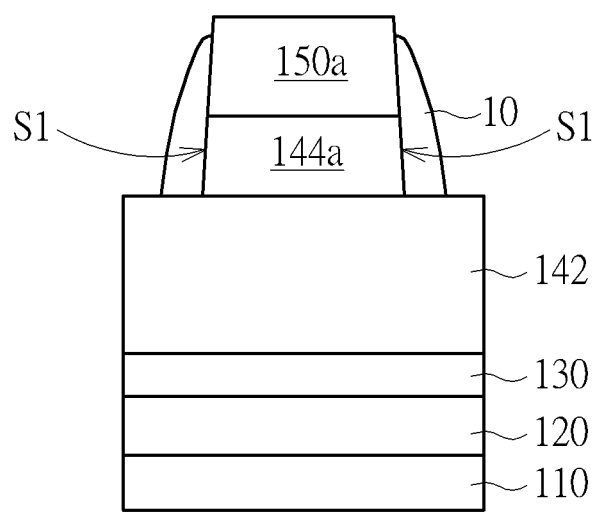
FIG. 4 schematically depicts a cross-sectional view of a method of forming a resistive random-access memory (RRAM) device according to an embodiment of the present invention.
Figure 5:
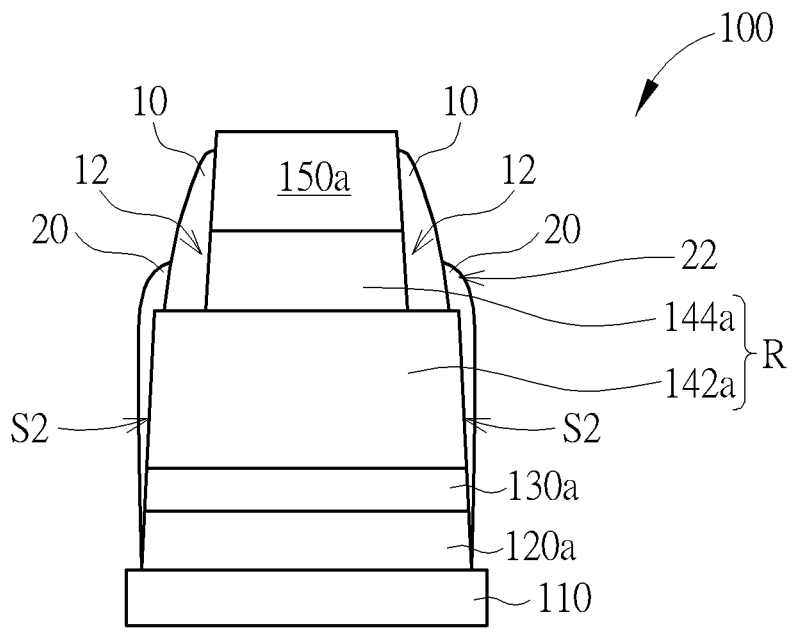
FIG. 5 schematically depicts a cross-sectional view of a method of forming a resistive random-access memory (RRAM) device according to an embodiment of the present invention.

Please refer to FIGS. 3-4, first spacers 10 are formed to cover sidewalls S1 of the top part 144a, to avoid above conductive structures from contacting to the top part 144a and make short circuit occur. In a preferred embodiment, the first spacers 10 may be silicon nitride spacers, but it is not limited thereto. As shown in FIG. 3, a spacer material layer 10a is deposited to conformally cover the bottom resistive layer 142, the top part 144a and the top electrode 150a. Then, the spacer material layer 10a is etched to form the first spacers 10. In this case, the first spacers 10 overlap and cover parts of the top electrode 150a to ensure the top part 144a is isolated by the first spacers 10, but the present invention is not restricted thereto.

Thereafter, the bottom resistive layer 142, the high work function material layer 130 and the bottom electrode layer 120 are patterned to form a bottom part 142a, a high work function layer 130a and a bottom electrode 120a. Thus, the bottom part 142a and the top part 144a constitute a resistive material layer R. In this case, the bottom electrode 120a, the high work function layer 130a and the bottom part 142a constitute a trapezoidal shape cross-sectional profile, but it is not limited thereto. In another case, the bottom electrode 120a, the high work function layer 130a and the bottom part 142a have a step-shape cross-sectional profile. Or, the bottom electrode 120a, the high work function layer 130a, the resistive material layer R and the top electrode 150a all have trapezoidal shape cross-sectional profiles, depending upon practical requirements.

Second spacers 20 are formed to cover sidewalls S2 of the bottom part 142a of the resistive material layer R, thereby constituting a RRAM cell 100. In this embodiment, the second spacers 20 may be high work function spacers, including materials like Iridium (Ir), but it is not limited thereto. Since the second spacers 20 are formed on the sidewalls S2 of the bottom part 142a of the resistive material layer R, this prevents oxygen atoms in a dielectric layer covering the RRAM cell 100 from diffusing into oxygen vacancies of the bottom part 142a, thereby degrading of switching resistance states can being avoided.

In a preferred embodiment, the bottom resistive layer 142, the high work function material layer 130 and the bottom electrode layer 120 are patterned and the second spacers 20 are formed in-situ, to avoid device pollution while performing processes and improve processing efficiency. In a still preferred embodiment, the second spacers 20 are formed by re-sputtering the high work function material layer 130 while the bottom resistive layer 142, the high work function material layer 130 and the bottom electrode layer 120 are etched while patterning. In this way, the high work function material layer 130 and the second spacers 20 have common materials such as Iridium (Ir) in this case. In this embodiment, the second spacers 20 directly stand on the high work function layer 130a by re-sputtering. Besides, the first spacers 10 directly stand on the bottom parts 142a of the resistive material layer R. Furthermore, top parts 22 of the second spacers 20 overlap bottom parts 12 of the first spacers 10, so that the resistive material layer R, especially for the bottom part 142a of the resistive material layer R, is not exposed.

Figure 6:
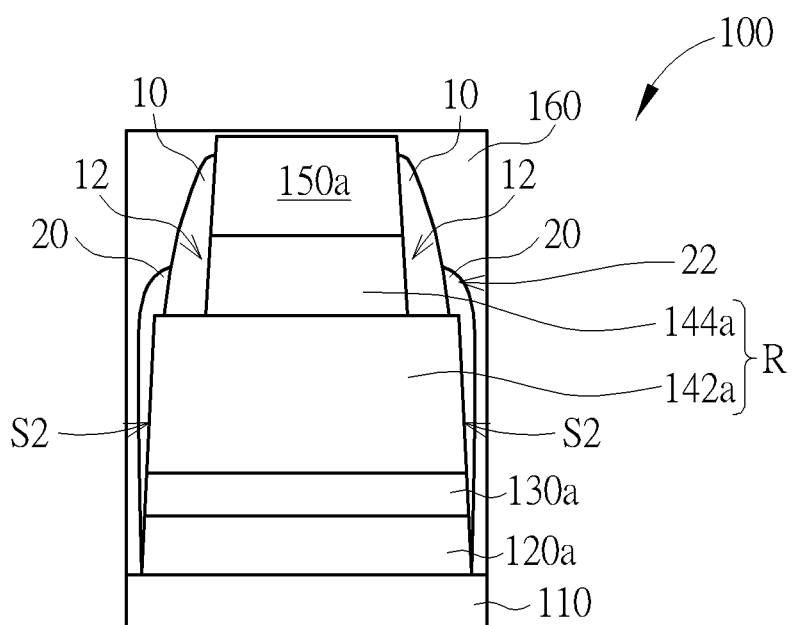
FIG. 6 schematically depicts a cross-sectional view of a method of forming a resistive random-access memory (RRAM) device according to an embodiment of the present invention.

As shown in FIG. 6, an inter-dielectric layer 160 is formed to blanketly cover the RRAM cell R. The inter-dielectric layer 160 may be an oxide layer. Oxygen atoms in the inter-dielectric layer 160 cannot diffuse to the bottom part 142a of the resistive material layer R by disposing the second spacers 20. Then, a voltage difference is forced to the RRAM cell 100 to form an oxygen vacancy part in the bottom part 142a for operating the RRAM cell 100.

To summarize, the present invention provides a resistive random-access memory (RRAM) device and forming method thereof, which forms two kinds of spacers to cover a resistive material layer, especially the second spacer having high work function materials covering the bottom part of the resistive material layer, to prevent oxygen atoms in a dielectric layer covering the RRAM cell from diffusing into oxygen vacancies of the resistive material layer, thereby degrading of switching resistance states can being avoided. For example, a bottom electrode layer, a high work function material layer, a bottom resistive layer, a top resistive layer, and a top electrode layer are sequentially deposited on a substrate; the top electrode layer and the top resistive layer are patterned to form a top electrode and a top part of a resistive material layer. First spacers are formed to cover sidewalls of the top part; the bottom resistive layer, the high work function material layer and the bottom electrode layer are patterned to form a bottom part of the resistive material layer, a high work function layer and a bottom electrode; Second spacers are formed to cover sidewalls of the bottom part, thereby constituting a RRAM cell.

Preferably, the bottom resistive layer, the high work function material layer and the bottom electrode layer are patterned and the second spacers are formed in-situ. Still preferably, the second spacers are formed by re-sputtering the high work function material layer while the bottom resistive layer, the high work function material layer and the bottom electrode layer are etched while patterning.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive random-access memory (RRAM) device, comprising:
   a bottom electrode, a high work function layer, a resistive material layer and a top electrode sequentially stacked on a substrate, wherein the resistive material layer comprises a bottom part and a top part;
   first spacers covering sidewalls of the top part and the top electrode; and
   second spacers covering sidewalls of the bottom part, thereby constituting a RRAM cell, wherein the second spacers directly stand on the high work function layer.

2. The resistive random-access memory (RRAM) device according to claim 1, wherein the bottom electrode and the top electrode comprise tantalum nitride (TaN) or titanium nitride (TiN).

3. The resistive random-access memory (RRAM) device according to claim 1, wherein the bottom electrode, the high work function layer, the resistive material layer and the top electrode all have trapezoidal shape cross-sectional profiles.

4. The resistive random-access memory (RRAM) device according to claim 1, wherein the bottom electrode, the high work function layer and the bottom part constitute one trapezoidal shape cross-sectional profile, and the top part and the top electrode constitute another trapezoidal shape cross-sectional profile.

5. The resistive random-access memory (RRAM) device according to claim 1, wherein the resistive material layer comprises a metal oxide layer.

6. The resistive random-access memory (RRAM) device according to claim 5, wherein the metal oxide layer comprises tantalum oxide or hafnium oxide.

7. The resistive random-access memory (RRAM) device according to claim 5, wherein the bottom part of the resistive material layer is a $Ta_2O_5$ layer and the top part of the resistive material layer is a $TaO_x$ layer.

8. The resistive random-access memory (RRAM) device according to claim 1, wherein the high work function layer and the second spacers comprise common materials.

9. The resistive random-access memory (RRAM) device according to claim 8, wherein the high work function layer and the second spacers comprise Iridium (Ir).

10. The resistive random-access memory (RRAM) device according to claim 1, wherein the first spacers comprise silicon nitride spacers.

11. The resistive random-access memory (RRAM) device according to claim 1, wherein tops of the second spacers overlap bottoms of the first spacers.

12. The resistive random-access memory (RRAM) device according to claim 1, wherein the first spacers directly stand on the bottom part of the resistive material layer.

13. The resistive random-access memory (RRAM) device according to claim 1, further comprising:
   an inter-dielectric layer blanketly covering the RRAM cell.

14. The resistive random-access memory (RRAM) device according to claim 13, wherein the inter-dielectric layer is an oxide layer.

* * * * *